United States Patent
Greenley et al.

(10) Patent No.: US 7,472,323 B1
(45) Date of Patent: Dec. 30, 2008

(54) MECHANISM TO STOP INSTRUCTION EXECUTION AT A MICROPROCESSOR

(75) Inventors: Dale Robert Greenley, Los Gatos, CA (US); Chitresh Chandra Narasimhaiah, San Jose, CA (US); Senthilkumar Diraviam, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 495 days.

(21) Appl. No.: 11/235,993

(22) Filed: Sep. 26, 2005

(51) Int. Cl.
*G01R 31/3177* (2006.01)
*G01R 31/40* (2006.01)

(52) U.S. Cl. .............................. 714/724; 714/34
(58) Field of Classification Search .................. None
See application file for complete search history.

(56) References Cited
U.S. PATENT DOCUMENTS 5,675,282 A * 10/1997 Saito ........................ 327/544
6,088,807 A * 7/2000 Maher et al. ................ 713/324
6,118,306 A * 9/2000 Orton et al. .................. 327/44
6,336,195 B1 * 1/2002 Shen et al. .................... 714/34

\* cited by examiner

*Primary Examiner*—Cynthia Britt
*Assistant Examiner*—Dipakkumar Gandhi
(74) *Attorney, Agent, or Firm*—Hickman Palermo Truong & Becker LLP

(57) ABSTRACT

A method and apparatus for stopping the internal clock of a microprocessor synchronously with the execution of an instruction is provided. A stop instruction is placed in a sequence of instructions to be executed by the microprocessor. The execution of the stop execution may store a stop value into a stop register of the microprocessor. Clock stop logic detects when the stop value has been stored into the stop register. The clock stop logic instructs a clock generation component, of the microprocessor, to cease generation of an internal clock signal, thereby preventing the microprocessor from changing state. As further instructions are not executed by the microprocessor, the state of the microprocessor reflects the execution of the instruction immediately prior to the stop instruction. The processing state of the microprocessor may be obtained for use in debugging the design of the microprocessor or the instructions executed thereby.

9 Claims, 2 Drawing Sheets

MECHANISM TO STOP INSTRUCTION EXECUTION AT A MICROPROCESSOR

BACKGROUND

Over time, the design of microprocessors, and the software executed by them, has grown in complexity. As a result, there is an increasing need to "debug" the design of microprocessors. Debugging, in this context, is the process of identifying why a particular instruction, executed by a microprocessor, led to an unintended result. Thus, the root cause of the unintended result (i.e., a problem or a "bug") may include the design of the microprocessor or the design of the software executed by the microprocessor.

Microprocessors execute instructions using an internal clock signal. A component of the microprocessor, referred to as a clock generation component, may receive a clock signal from a source external to the microprocessor. The clock generation component may thereafter generate the internal clock signal for use by components of the microprocessor. The components of the microprocessor perform functions using the internal clock signal generated by the clock generation component.

To illustrate, a microprocessor may execute two or more instructions, in a sequence of instructions, in a pipeline fashion by processing instructions in several stages. At a rising edge of an internal clock signal, components of the microprocessor may perform a first stage operation on instruction A. At the next rising edge of the internal clock signal, the components of the microprocessor may perform a second stage operation on instruction A, and a first stage operation on instruction B, and so on. Thus, in this example, at each rising edge of the internal clock signal, the execution of an instruction may be initiated, and therefore, the value maintained by storage elements (such as flip-flops and latches) of the microprocessor may change.

One approach for debugging the design of a microprocessor involves a user causing a microprocessor to execute the sequence of instructions, and if a problem is detected (for example, the microprocessor appears to be hanging), the user transmits a signal (a "stop signal") using a clock stop mechanism, to the microprocessor, to stop the generation of the internal clock signal. Components of the microprocessor cease to receive the internal clock signal once the internal clock signal is no longer generated. Since the internal clock signal drives the performance of the components of the microprocessor, when the components of the microprocessor no longer receive the internal clock signal, the components of the microprocessor cease performing their functions. In this way, once the components of the microprocessor no longer receive the internal clock signal, no further instructions are executed and the state of the microprocessor is maintained. The state of the microprocessor may be subsequently retrieved for use in debugging the design of the microprocessor.

The clock stop mechanism may be implemented using the JTAG (Joint Test Access Group) protocol, which is a commonly used name for referring to the IEEE standard 1149.1. The JTAG protocol specifies how to control and monitor the pins of compliant devices, and may be used to (a) stop the generation of an internal clock signal received by components of the microprocessor and (b) retrieve the contents of flip-flops and registers of the microprocessor.

While this approach allows the state of the microprocessor to be preserved contemporaneously with the receipt, by the microprocessor, of the stop signal, this preserved state may be long after the execution of the instruction that caused the problem. Thus, a user is required to make educated guesses as to the reason(s) the problem was encountered based on the preserved state of the microprocessor.

Another approach for debugging a sequence of instructions executed by a microprocessor involves designing, in the microprocessor, event logic that detects the occurrence of a particular event, such as an undesirable state of the microprocessor. Whenever that event is detected by the event logic, the event logic may generate a stop signal to cease the generation of clock signals received by components of the microprocessor, thereby preserving the state of the microprocessor contemporaneous with the occurrence of the event. This approach has limited value for debugging the design of the microprocessor because, if the microprocessor is configured to include event logic that is designed to detect a particular event, then typically the particular event is not indicative of the problem that is causing the bug in the execution of instructions by the microprocessor since the designer of the microprocessor is likely aware that such a problem may occur. In other words, unknown problems typically cause more bugs than known problems.

Consequently, what is needed in the art is an approach for debugging the design of a microprocessor, which does not incur the disadvantages associated with the prior approaches. The approaches described in this section are approaches that could have been pursued, but not necessarily approaches that have been previously conceived or pursued. Therefore, unless otherwise indicated, it should not be assumed that any of the approaches described in this section qualify as prior art merely by virtue of their inclusion in this section.

SUMMARY

Embodiments of the invention operate under the recognition that prior approaches for debugging the design of a microprocessor were limited because the internal clock of the microprocessor could only be stopped asynchronously to the execution of the instructions that cause the unintended results. Thus, various approaches for synchronizing the stopping of the internal clock of a microprocessor with the execution of an instruction by the microprocessor are presented herein. According to one aspect of the invention, a user inserts a stop instruction into a sequence of instructions to be executed by the microprocessor. The execution of stop instruction by the microprocessor causes the internal clock of the microprocessor to stop. Since the internal clock of the microprocessor is stopped, the state of the microprocessor is preserved. Advantageously, the preserved state of the microprocessor allows a user to debug the design of the microprocessor with greater ease and precision than prior approaches, since the user knows at which point, in the sequence of instructions, instructions ceased to be executed by the microprocessor.

BRIEF DESCRIPTION OF THE DRAWINGS

Embodiments of the present invention are illustrated by way of example, and not by way of limitation, in the figures of the accompanying drawings and in which like reference numerals refer to similar elements and in which.

DETAILED DESCRIPTION OF EMBODIMENT(S)

Figure 1:
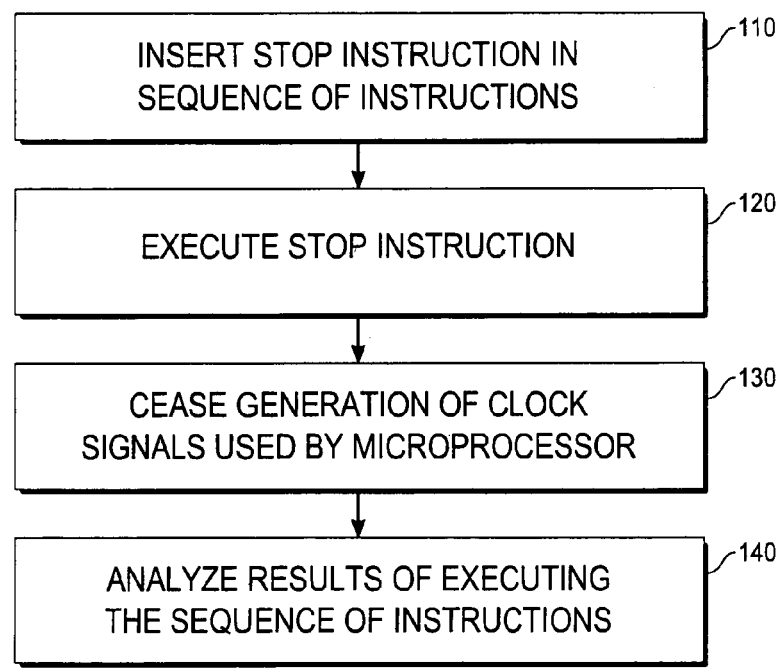
FIG. 1 is a flowchart illustrating the functional steps according to an embodiment of the invention.

In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Functional Overview

According to an embodiment, a user inserts a stop instruction into a sequence of instructions executed by a microprocessor. For example, a user may insert the stop instruction into a sequence of instructions expressed in assembly language. When the microprocessor executes the stop instruction, a clock generation component is instructed to cease generating an internal clock signal. Since the components of the microprocessor stop receiving the internal clock signal, the processing core of the microprocessor stops executing instructions. As a result, the state of the microprocessor is preserved contemporaneous with the execution of the stop instruction. The state of the microprocessor (e.g., the values stored in the flip-flops and registers of the microprocessor) may be retrieved for use in debugging the design of the microprocessor.

Various approaches for implementing a stop instruction are described herein. According to one approach, the stop instruction may be implemented as a store instruction which, when executed, stores a particular value into a register. Once the microprocessor detects that the particular value is stored in the particular register, the microprocessor may cease the generation of an internal clock signal, thereby preserving the state of the microprocessor contemporaneous with the execution of the stop instruction. In another approach, a stop instruction may be implemented by adding a new instruction to the instruction set (ISA) of a microprocessor. The execution of the new instruction instructs the microprocessor to cease generating an internal clock signal, thereby preserving the state of the microprocessor contemporaneous with the execution of the new instruction.

Advantageously, using the approaches described herein, a user gains improved visibility into, and control of, the results of instructions executed by a microprocessor. Specifically, to debug the design of the microprocessor, a user may insert a stop instruction into a sequence of instructions to be executed by the microprocessor, thereby creating two logical portions, of the sequence of instructions, separated by the stop instruction. Once the first portion of the sequence of instructions is executed, the stop instruction will be executed by the microprocessor, thereby causing the clock generation component to cease the generation of internal clock signals, which in turn, causes the state of the microprocessor to be preserved.

After the clock generation component has ceased generating the internal clock signal, the user may retrieve the state of the microprocessor, and subsequently analyze the state of the microprocessor for debugging purposes. If a problem is not detected, then the user may determine that the problem is not caused by an instruction in the first portion of the sequence of instructions. Thereafter, the user may move the stop instruction to a later position in the sequence of instructions, and repeat the process in order to further refine his or her search for any problems caused by the execution of the sequence of instructions. If a problem is detected, the user may move the stop instruction to an earlier position in the sequence of instructions, and repeat the process in order to further refine his or her search for which instruction, in the executed set of instructions, caused the problem.

Stopping Instruction Execution at a Microprocessor

Having described the high level operation of the invention, a more detailed description of an embodiment will be presented with reference to FIG. 1, which is a flowchart illustrating the functional steps according to an embodiment of the invention. The steps of FIG. 1 shall be explained below with reference to FIG. 2, which is a block diagram of a microprocessor 200 according to an embodiment of the invention.

Figure 2:
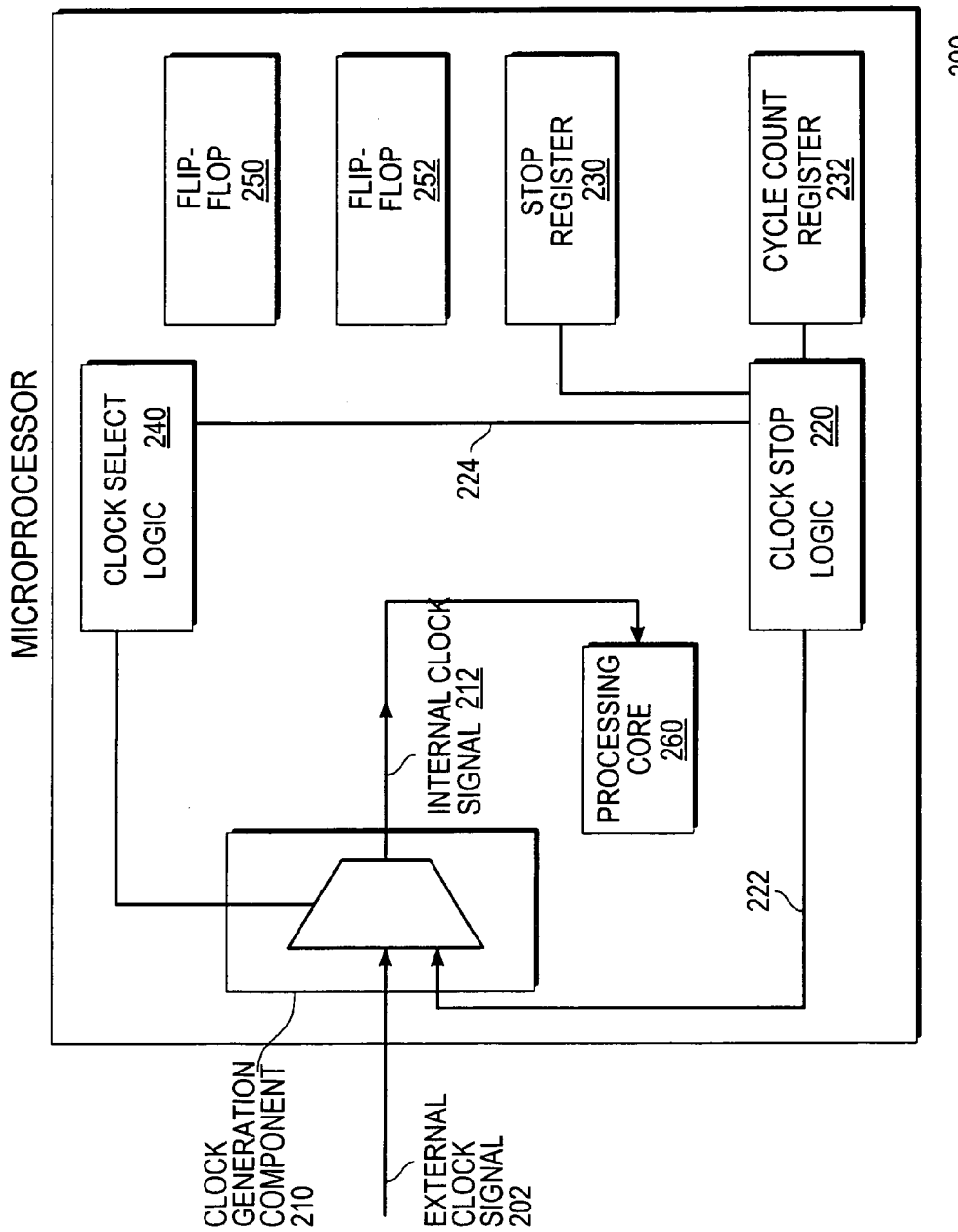
FIG. 2 is a block diagram of a microprocessor according to an embodiment of the invention.

FIG. 2 depicts a microprocessor 200 that comprises a clock generation component 210, a processing core 260, and flip-flops 250 and 252. Clock generation component 210 may be implemented by any component, within microprocessor 200, which is capable of generating an internal clock signal 212 using an external clock signal 202 received by microprocessor 200. In an embodiment, the clock generation component 210 may be implemented using, at least in part, a multiplexer which produces an output (the internal clock signal 212) based on, at least in part, a selected input from two or more inputs to the clock generation component 210. As explained in further detail below, the clock select logic 240 may instruct the clock generation component 210 on whether to produce the internal clock signal 212 using the external clock signal 202 or a signal carried by signal line 222.

External clock signal 202 refers to a clock signal that is propagated to the microprocessor 200 from the surrounding circuitry. The internal clock signal 212 drives the operation of the components of the microprocessor 200, such as the processing core 260. For simplicity, only processing core 260 is shown in FIG. 2 as being coupled to the internal clock signal 212. In other embodiments not shown in FIG. 2, the internal clock signal 212 may be received by other components of microprocessor 200. The processing core 260 is responsible for executing instructions. The execution of instructions, by the processing core 260, may result in information being stored in a storage element, such as, but not limited to, one or more flip-flops (such as flip-flops 250 and 252), registers, and latches. Note that the depiction of flip-flops in FIG. 2 is merely illustrative, as the storage elements of a microprocessor which may be used for storing information are not limited to the use of flip-flops.

Initially, in step 10 of FIG. 1, a user inserts a stop instruction into a sequence of instructions to be executed by a microprocessor. In an embodiment, the stop instruction may be implemented as a store instruction that, when executed, stores a stop value into a particular register. The stop value stored by the stop instruction may be any value, e.g., a value represented by a single bit or two or more bits. Stop register 230, as shown in FIG. 2, represents the particular register to which the stop value stored when the stop instruction is executed.

A user may insert the stop instruction into the sequence of instructions in a variety of ways. In one embodiment, the user may insert the stop instruction into a sequence of instructions expressed in assembly language. In other embodiments, the user may insert the stop instruction into a sequence of instructions expressed in machine language. The user may use a software tool, such as a graphical user interface, to aid the insertion of the stop instruction into a particular position within the sequence of instructions.

The particular position, within the sequence of instructions, where the user inserts the stop instruction corresponds to the point at which the user wishes to stop the execution of the sequence of instructions by the microprocessor. For example, a user may insert the stop instruction either at an arbitrary point (such as halfway through the sequence of instructions), to analyze the behavior of executing the sequence of instructions from the beginning of the sequence to the point at which the stop instruction has been inserted. As another example, a user may wish to insert the stop instruction immediately after a particular point in the sequence of instructions where the user suspects the execution of a specific instruction may be causing an unintended result. In this way, to debug the design of the microprocessor, the user may use an embodiment to view the result of executing the sequence of instructions up to an including the specific instruction (which immediately precedes the stop instruction) whose execution the user suspects is producing the unintended result.

After the user has inserted the stop instruction into the sequence of instructions, the sequence of instructions is recompiled, with the stop instruction, into a format executable by microprocessor 200. After the sequence of instructions is compiled into a format executable by microprocessor 200, processing proceeds to step 120.

In step 120, the sequence of instructions is executed, up to and including the stop instruction. In other words, the beginning of the sequence of instructions is executed by the processing core 260 of microprocessor 200, and the processing core 260 continues to execute instructions, in sequence, until the stop instruction is encountered and executed.

In an embodiment, the execution of the stop instruction causes a stop value to be stored within the stop register 230. After the stop value is stored within the stop register 230, processing proceeds to step 230.

In step 130, the execution of the stop instruction ceases the generation of internal clock signal 212 received by components of microprocessor 200. Various approaches for ceasing the generation of internal clock signal 212 may be employed. In one approach, clock stop logic 220 checks the stop register 230 to determine whether the stop value has been stored therein. After the stop value has been stored in the stop register 230, the clock stop logic detects that the stop value has been stored in the stop register 230. Clock stop logic 220 may be implemented by any logic that is configured to detect when the stop value is stored within the stop register 230. In an embodiment, clock stop logic 220 may be implemented using a hardwired logic component of microprocessor 200.

In response to clock stop logic 220 detecting that the stop value has been stored in stop register 230, clock stop logic 220 causes the clock generator component 210 to stop generating internal clock signal 212. The clock stop logic 220 may cause the clock generator component 210 to cease the generation of internal clock signal 212 by communicating with clock select logic 240 over signal line 224. Clock select logic 240 may be implemented by any logic for determining upon which input signal, to the clock generation component 210, the generation of the internal clock signal 212 should be based. In an embodiment, clock select logic 240 may be implemented using a hardwired logic component of microprocessor 200.

To illustrate, clock select logic 240 may instruct clock generation component 210 to generate internal clock signal 212 using the external clock signal 202. However, to cause the clock generator component 210 to cease the generation of internal clock signal 212, the clock stop logic 220 may instruct, over signal line 224, the clock select logic 240 to instruct the clock generation component 210 to generate internal clock signal 212 using the signal carried by signal line 222. Signal line 222 carries a signal produced by clock stop logic 220. If clock stop logic 220 produces a continuous logic low value ("0") over signal line 222, and the clock generation component 210 bases the internal clock signal 212 on signal line 222, then the internal clock signal 212 will also be a continuous logic low value ("0").

Thus, to cause the clock generator component 210 to cease the generation of internal clock signal 212, the clock stop logic 220 may (a) instruct clock select logic 240 to instruct clock generation component 210 to base the generation of internal clock signal 212 on signal line 222, and (b) produce a continuous logic low value ("0") over signal line 222. Since the signal carried by signal line 222 does not transition from a logic low value to a logic high value, or vice-versa, the internal clock signal 212 will also not transition from a logic low value to a logic high value, or vice-versa, because the internal clock signal 212 is generated using the signal carried by signal line 222.

The internal clock signal 212 drives components of microprocessor 200, including the processing core 260, which is responsible for executing instructions. When the internal clock signal 212 does not transition (i.e., it is driven to a continuous logic low value), the processing core 260 halts execution of further instructions. After the clock generation component 210 has ceased the generation of internal clock signal 212, and thereby halting the execution of instructions by the processing core 260, step 140 of FIG. 1 is performed.

In step 140, as the microprocessor 200 has ceased executing instructions, the results of executing the sequence of instructions, up to and including the stop instruction, may be analyzed. Since the processing core 260 has halted execution of any further instructions, the current state of microprocessor 200 is preserved. Thus, each flip-flop and register of microprocessor 200 reflects the state of processing the sequence of instructions up to the instruction that immediately preceded the stop instruction.

The state of the microprocessor may be retrieved for use in analyzing the operation of the instructions that were executed using standard techniques known in the art. For example, a user may retrieve the contents of flip-flops and registers from microprocessor 200 using standard techniques, such as the use of the JTAG protocol. For example, the values stored by flip-flop 250 and 252 may be retrieved from microprocessor 200 using the JTAG protocol.

A user may analyze the state of the microprocessor for debugging purposes. For example, the user may use the state of the microprocessor to determine whether the design of the microprocessor produced the intended results for the set of the instructions executed by the microprocessor. If a clue to the problem is not detected in the portion of instructions executed, then the user may determine that the executed portion of the sequence of instructions does not produce the problem (or bug). Thereafter, the user may move the stop instruction further along in the sequence of instructions, and re-execute the sequence of instructions (which will be stopped at the new location of the stop instruction) in order to further refine his or her search for any bugs in the design of the microprocessor or the sequence of instructions executed by the microprocessor. Because the user inserts the stop instruction into the sequence of instructions, the user knows at which point, in the sequence of instructions, that instruction execution will cease, thereby enabling the user to make better use of the retrieved state of microprocessor 200.

In embodiments of the invention, the clock generation component 210 may be stopped at a variable number of clock cycles after the stop instruction is executed by the microprocessor 200, as explained in further detail below.

Adjusting when the Internal Clock is Stopped

In debugging the design of the microprocessor, it may be desirable to stop the internal clock signal 212 at various points in the execution of the sequence of instructions to allow the user to view various states of the microprocessor. Adding a stop instruction into a new location in the sequence of instructions executed by the processor core 260 requires a certain amount of time. To avoid this overhead, a user may wish to wait a configurable number of clock cycles, after the execution of the stop instruction, before the clock generation component 210 ceases to generate internal clock signal 212. Thus, by waiting a configurable number of clock cycles from when the stop instruction is executed to when the clock generation component ceases to generate the internal clock signal 212, the user may obtain information about different processing states of microprocessor 200 without moving the location of the stop instruction within the location of the sequence of instructions executed by the processing core 260.

According to one embodiment, a user stores a count value in a cycle count register 232. The count value indicates how many clock cycles, after the execution of the stop instruction, the clock stop logic 220 should wait before instructing the clock generation component 210 to cease generation of the internal clock signal 212. After the clock stop logic 220 detects that the stop value has been stored in the stop register 230, the clock stop logic 220 checks the count value in the cycle count register 232 to determine how many clock cycles to wait before the clock stop logic 220 instructs the clock generation component 210 to cease generating the internal clock signal. The count value may be stored in the cycle count register 232 using standard techniques, e.g., an instruction may be added to the sequence of instructions which, when executed, loads the count value into the cycle count register 232 or the JTAG protocol may be used.

In an embodiment, the internal clock signal 212 may reflect a magnified number of clock cycles of the external clock signal 202. For example, if the external clock signal 202 is performing at 150 MHz, then the internal clock signal 212 may be performing at 8 times the external clock signal 202 (1200 MHz or 1.2 GHz). The number of clock cycles indicated by the count value may refer to either a number of external clock cycles (i.e., the clock cycles of the external clock signal 202) to wait or a number of internal clock cycles (i.e., the clock cycles of the internal clock signal 212) to wait. In one embodiment, a default may be established as to whether the count value refers to the number of clock cycles of the external clock signal 202 or the internal clock signal 212. In another embodiment, information may be stored in the microprocessor 200 (for example, the information may be identified within the count value) that identifies whether the count value refers to the number of clock cycles of the external clock signal 202 or the internal clock signal 212.

In one embodiment, the cycle count register 232 may be implemented using the same register that implements the stop register 230, and the stop value and the count value may be the same value. In such an embodiment, the execution of the stop instruction would cause a single value to be stored in a single register. The single value would perform the functions of both the stop value and the count value.

In another embodiment, the value stored in the cycle count register 232 or the stop register 230 may be used to identify a loop stop value. Instructions may be executed in a finite or infinite loop. For example, some instructions may be executed in a loop four times, two million times, or an infinite number of times. It may be desirable to stop the generation of internal clock signal 212 after a specified number of times, e.g., a problem may not show up until the 50,000 iteration of the loop. A loop stop value indicates a number of times which an instruction set may loop before the internal clock signal 212 is stopped. In such an embodiment, after each loop, a loop counter (not shown in FIG. 2) is incremented. When the loop counter reflects a value that is equal to the loop stop value, the microprocessor 200 interrupts such an event as a stop instruction, and clock stop logic 220 instructs the clock generation component 210 to cease generating the internal clock signal 212.

Adding the Stop Instruction to an Instruction Set

In an alternate embodiment, the stop instruction may be implemented as a new instruction added to the instruction set recognized by the microprocessor 200. Thus, instead of the stop instruction being implemented using a store instruction that stores, when executed, a particular value to a register, the stop instruction is implemented by adding a new instruction to the instruction set (ISA). To add a new instruction to the ISA, a new opcode will need to be associated with the function of instructing the clock generation component 210 to cease generating the internal clock signal 212. Thus, when the processing core 260 executes the new instruction, the execution of the new instruction will cause the clock stop logic 220 to instruct clock generation component 210 to cease the generation of internal clock signal 212, as described above.

Restricting Access from a Set of Users

Embodiments of the invention described herein are intended for use in debugging the design of a microprocessor 200. As such, users debugging the design of a microprocessor 200 may use embodiments of the invention to prevent the intended users of the microprocessor 200 to stop the generation of the internal clock signal 212. To that end, restrictions may be placed that prevent certain users (such as the ultimate end user of microprocessor 200), and allow other users (such as the designers of microprocessor 200), to (a) load a stop value into the stop register 230, (b) load a count value into the cycle count register 232, or (c) insert a stop instruction into the sequence of instructions executed by microprocessor 200. In this way, those debugging the microprocessor 200 may use embodiments of the invention to debug the microprocessor, but end-users of the microprocessor 200 are prevented from employing embodiments of the invention to stop the internal clock of the microprocessor 200.

Using Illegal or Undefined Instructions to Stop the Internal Clock

In an embodiment of the invention, an illegal or undefined instruction may be used to stop the generation of clock signals by the clock generation component 210. In such an embodiment, this feature may be turned on and off by a variety of means, e.g., a JTAG command or operating system command may be used to turn this feature on or off. If this feature is turned on, then when a particular type of illegal or undefined instruction is processed by the processing core 260, the microprocessor 200 interprets the processing of the illegal or undefined instructions as a stop instruction, i.e., the clock stop logic 220 instructs the clock generation component 210 to stop generating the internal clock signal 212. The particular type of illegal or undefined instruction, which when executed is interrupted as a stop instruction, may be configured or set as a default in this embodiment. In this way, more freedom may be provided to the microprocessor debugger as to which instructions may be used to stop the generation of internal clock signals.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A processor, comprising:
   a first register;
   a clock generator for generating a clock signal;
   a processing core for executing instructions in response to the clock signal, wherein the instructions include a particular instruction and one or more subsequent instructions, and wherein execution of the particular instruction causes the processing core to load a special value into the first register; and
   clock stop logic for checking the first register for the special value, and in response to detecting the special value in the first register, causing the clock generator to stop generating the clock signal before the processing core executes any of the subsequent instructions, thereby causing the processing core to halt execution after the particular instruction is executed and before any of the subsequent instructions are executed.

2. The processor of claim 1, further comprising:
   a second register,
   wherein the clock stop logic is configured, in response to detecting the special value in the first register, to cause the clock generator to stop generating the clock signal after a number a clock cycles corresponding to a value stored in the second register.

3. The processor of claim 2, wherein the value stored in the second register is the special value, and wherein the second register is the first register.

4. A processor, comprising:
   a clock generator for generating a clock signal;
   a processing core for executing a sequence of instructions, wherein the processing core operates in response to the clock signal, and wherein the sequence of instructions comprises a special instruction and one or more subsequent instructions; and
   clock stop logic for causing, in response to the execution of the special instruction by the processing core, the clock generator to stop generating the clock signal before the processing core executes any of the subsequent instructions, thereby causing the processing core to halt execution after the special instruction is executed and before any of the subsequent instructions are executed.

5. The processor of claim 4, wherein the clock stop logic is configured, in response to execution of the instruction, to cause the clock generator to stop generating the clock signal after a number a clock cycles corresponding to a value indicated by the special instruction.

6. The processor of claim 4, wherein the special instruction is not a load instruction.

7. A method, comprising:
   receiving, from a user, a request to insert a particular instruction into a particular location within a sequence of instructions;
   in response to the request from the user, inserting the particular instruction into the particular location within the sequence of instructions such that the particular instruction is followed by one or more subsequent instructions;
   executing, by a processor, the particular instruction to cause a special value to be loaded into a first register, wherein the processor operates in response to a clock signal generated by a clock generator;
   checking the first register for the special value;
   in response to detecting the special value in the first register, causing the clock generator to stop generating the clock signal before the processor executes any of the subsequent instructions, thereby causing the processor to halt execution after the particular instruction is executed and before any of the subsequent instructions are executed; and
   providing information to the user indicating a current state of the processor after executing the particular instruction to enable the user to determine whether the processor operated properly.

8. The method of claim 7, wherein causing the clock generator to stop generating the clock signal comprises:
   reading a second value in a second register; and
   causing the clock generator to stop generating the clock signal after a number of clock cycles corresponding to the second value.

9. The method of claim 8, wherein the first register is the second register, and wherein the first value is the second value.

* * * * *